(12) United States Patent
Dieckmann et al.

(10) Patent No.: US 6,707,537 B2
(45) Date of Patent: Mar. 16, 2004

(54) PROJECTION EXPOSURE SYSTEM

(75) Inventors: Nils Dieckmann, Aalen (DE); Jess Köhler, Oberkochen (DE); Johannes Wangler, Königsbronn, DE (US)

(73) Assignee: Carl Zeiss Semiconductor Manufacturing Technologies AG (DE)

( * ) Notice: Subject to any disclaimer, the term of this patent is extended or adjusted under 35 U.S.C. 154(b) by 0 days.

(21) Appl. No.: 10/189,279

(22) Filed: Jul. 2, 2002

(65) Prior Publication Data

US 2003/0030780 A1 Feb. 13, 2003

(51) Int. Cl.⁷ .......................... G03B 27/54; G03B 27/72
(52) U.S. Cl. ............................. 355/67; 355/53; 355/71
(58) Field of Search .............................. 355/53, 67, 71; 359/569, 575, 618

(56) References Cited

U.S. PATENT DOCUMENTS

| | | | |
|---|---|---|---|
| 5,572,287 A | * 11/1996 | Wangler et al. | 355/53 |
| 5,646,715 A | * 7/1997 | Wangler | 355/67 |
| 5,675,401 A | * 10/1997 | Wangler et al. | 355/67 |
| 5,896,188 A | * 4/1999 | McCullough | 355/67 |
| 6,084,655 A | 7/2000 | Suzuki et al. | 355/53 |
| 6,128,068 A | 10/2000 | Suzuki et al. | 355/53 |
| 6,285,443 B1 | * 9/2001 | Wangler et al. | 355/67 |

FOREIGN PATENT DOCUMENTS

| | | | |
|---|---|---|---|
| DE | 4342424 A1 | * | 6/1995 |
| DE | 195 20 563 A1 | | 12/1996 |
| DE | 697 03 165 T2 | | 5/2001 |
| DE | 100 62 579 A | | 7/2001 |
| EP | 0 744 641 A2 | | 11/1996 |
| JP | 7-201697 | | 8/1995 |
| JP | 8-286382 | | 11/1996 |

* cited by examiner

Primary Examiner—Alan A. Mathews
(74) Attorney, Agent, or Firm—Factor & Partners

(57) ABSTRACT

A projection exposure system, in particular for microlithography, serves to generate an image of an object disposed in an object plane in an image plane. For this purpose, use is made of a light source emitting projection light, illumination optics disposed in the beam path between the light source and the object plane and projection optics disposed in the beam path between the object plane and the image plane. Disposed in the vicinity of a field plane of the illumination optics is at least one optical element that changes the angular illumination distribution of the projection light passing through. The change, impressed by the optical element, in the angular illumination distribution is non-rotationally symmetrical with respect to the optical axis. The optical element can be disposed in various angular positions around an axis perpendicular to the field plane. Such an optical element makes it possible to modify the symmetry of the angular illumination distribution flexibly.

23 Claims, 3 Drawing Sheets

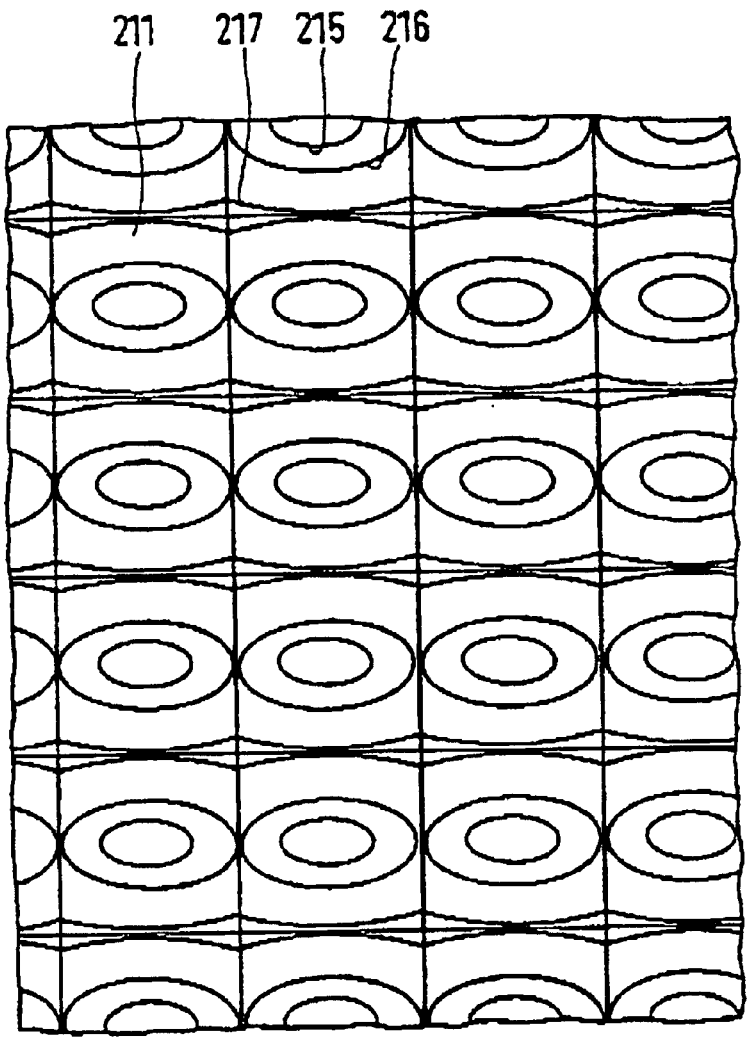

PROJECTION EXPOSURE SYSTEM

BACKGROUND OF THE INVENTION

The invention relates to a projection exposure system, in particular for microlithography, for generating an image of an object disposed in an object plane in an image plane by means of a light source emitting projection light, having illuminating optics disposed in the beam path between the light source and the object plane and having projection optics disposed in the beam path between the object plane and the image plane, wherein there is disposed in the vicinity of a field plane of the illumination optics at least one optical element that changes the angular illumination distribution of the projection light in the object plane, wherein the change, imposed by the optical element, in the angular illumination distribution in the object plane is non-rotationally symmetrical with respect to the optical axis.

The term "angular illumination distribution" denotes the energy of the illumination light as a function of the beam direction of the illumination light. Examples of light sources having a rotationally symmetrical angular illumination distribution are a spherically radiating light source or a laser in a $TEM_{00}$ fundamental mode.

To characterize angular illumination distributions that are non-rotationally symmetrical (or rotationally asymmetrical ones), use is made to a first approximation within the scope of the description below of a quantity that is described as ellipticity. The ellipticity of a projection light beam containing rays having different direction is determined by projection of the direction vector beam representing the ray directions of the projection light beam in a plane perpendicular to the optical axis. Said plane in which all direction vectors of the direction vector beam intercept is subdivided for this purpose into four sectors, in this case therefore into quadrants, that are enumerated, for example, from 1 to 4 in the clockwise direction.

In this connection, every direction vector has a length that corresponds to the projection light energy radiated in said direction. To determine the ellipticity, the resulting projections of the direction vectors of the direction vector beam are separately integrated in the four quadrants, and this results in the energy integration values $E_1$ to $E_4$ for the four quadrants.

The ellipticity is then given as the ratio:

$$(E_1+E_3)/(E_2+E_4).$$

The deviation of the value of the ellipticity from 1 is a measure of the deviation to a first approximation of the angular illumination distribution from the rotational symmetry. It is clear that division of the projection plane into a greater number of sectors makes possible a correspondingly better description of the symmetry ratio of the angular illumination distribution. Thus, a doubling from 4 to 8 sectors can describe not only a two-fold deviation from rotational symmetry, as is the case for ellipticity, but a 4-fold deviation. For the description below, the ellipticity serves as a non-restrictive example of a non-rotationally symmetrically angular illumination distribution, which may, in practice, also be non-rotationally symmetrical in higher orders (higher multiplicities).

A projection exposure system of the type mentioned at the outset is disclosed in DE 195 20 563 A1. The optical elements that modify the angular illumination distribution in a non-rotationally symmetrical manner serve in this case to shape a projection light beam in such a way that the rectangular entry face of a glass rod used to homogenize the projection light in the illumination optics is illuminated as efficiently as possible.

In the case of projection exposure systems, in particular in the case of those that employ projection light in the deep ultraviolet (DUV), there are a number of mechanisms that result in non-rotationally symmetrical changes in the angular illumination distribution in the illumination of the object, in which connection said changes have, as a rule, to be corrected. Such mechanisms are, for example, a non-rotationally symmetrical light distribution from the light source, optical elements in the illumination optics having non-rotationally symmetrical imaging properties, such as, for example, a non-rotationally symmetrically imaging diffractive optical element, or a glass rod having a non-rotationally symmetrical cross section. Furthermore, depending on the illumination conditions of the illumination or projection optics, the illumination-induced extension or the illumination-induced change in the refractive index of optical components that may modify non-rotationally symmetrical imaging properties of the latter are also relevant. In the case of certain applications of projection exposure systems, for example in the case of reticle structures with preferred directions, a systematically adjustable, non-rotationally symmetrical angular illumination distribution may also be desirable.

The object of the present invention is therefore to develop a projection exposure system of the type mentioned at the outset in such a way that the symmetry of the angular illumination distribution can be modified more flexibly.

This object is achieved according to the invention in that the optical element can be disposed in various angular positions around an axis perpendicular to the field plane.

SUMMARY OF THE INVENTION

According to the invention, the degree of rotational asymmetry can be adjusted by the choice of the optical element and by its angular position. This can be utilized, for example, to symmetrize a non-rotationally symmetrical angular illumination distribution produced in other components of the illumination or projection optics. Alternatively, that component of the non-rotationally symmetrical angular illumination distribution that can be adjusted by means of the rotatable optical element can be used for systematically introducing a non-rotationally symmetrical angular illumination distribution for certain illumination purposes.

The optical element may be rotatable around an axis perpendicular to the field plane. Such an optical element can easily be adjusted to various angular positions around an axis perpendicular to the field plane.

Alternatively, to modify the angular illumination distribution of the projection light in the object plane, a plurality of optical elements that can be introduced interchangeably into the beam path of the projection exposure system are provided in an interchange holder. The relative angular position of the individual optical elements may, in this case, already be pre-aligned in the interchange holder so that, when the optical element is introduced into the beam path of the projection exposure system, fine adjustment of the angular position is no longer necessary.

The optical element that can be disposed in various angular positions may be a diffractive optical element. Such optical elements can be designed in such a way that only a little material of the projection light has to pass through them. On the other hand, the imaging action of diffractive optical elements may be varied in wide ranges during their production. The optical element that can be disposed in various angular positions may be a raster element having a two-dimensional raster structure that is made up of a multiplicity of individual structures adjoining one another and having identical area configuration. Such raster elements may function diffractively, but alternatively also refractively in the form, for example, of a lens array or even reflectively. Such optical elements, in which, for example, the non-rotationally symmetrical modification of the angular illumination distribution can be predetermined, can be produced at acceptable cost.

Preferably, the individual structures adjoin one another without gap. In this way, optical elements having high efficiency for the projection light they modify can be constructed.

The individual structures may be designed in such a way that a non-rotationally symmetrical change in the angular illumination distribution they impress is based at least partly on a non-homogeneous modification of the diffraction of the projection light. In this case, the diffraction structures within an individual structure are constructed in such a way that the projection light modified by an individual structure is changed non-rotationally symmetrically in its angular illumination distribution. The shape of the boundary of such individual structures can then be chosen freely within certain limits so that individual structures having particularly simply producible boundary shape can be chosen. Relatively complex deviations in the modification of the angular illumination distribution of the projection light from rotational symmetry can be achieved by means of the configuration of the diffraction structures within an individual structure.

Alternatively, but also additionally, the individual structures can be designed in such a way that the non-rotationally symmetrical change in the angular illumination distribution they impress is based at least partly on a non-rotationally symmetrical boundary of the individual structures. The modification of the angular illumination distribution by the optical element that can be disposed in various angular positions can be predetermined by the area configuration of the individual structures. The more strongly the surface areas of the individual quadrants of the individual structure differ, for example, in the case of an individual structure functioning as a convergent or divergent lens, the greater is the modification of the ellipticity of the angular illumination distribution of an optical element having such individual structures.

An individual structure can have the shape of a hexagon. Such optical elements are known. Since the surface areas of the quadrants of a hexagon differ only relatively little, a fine adjustment of the angular illumination distribution is possible with such individual structures. Alternatively, the individual structures may also have other shapes, for example be designed as hexagons having mutually opposite extended sides, as rectangles or as other structures with which a preferably gapless area structure is possible.

A preferred refinement of the invention has at least two optical elements that are each disposed in the vicinity of a field plane of the illumination optics which change the angular illumination distribution of the projection light passing through and can be disposed, independently of one another, in various angular positions around an axis perpendicular to the field plane. Such an arrangement increases the number of adjustable degrees of freedom for predetermining a certain angular illumination distribution. In particular, the degree of the rotational asymmetry produced by the two optical elements can be adjusted.

In this connection, a change in the symmetry of the angular illumination distribution does not result in a relative position of the optical elements. With an arrangement that permits such a "neutral position", the symmetry of the angular illumination distribution of the remaining optical components of the projection exposure system can easily be determined for checking purposes.

Preferably, a drive device is provided that is coupled to the optical element that can be disposed in various angular positions. Such a drive device designed, for example, as a stepping motor permits a reproducible adjustment of the position of the optical element.

Additionally, a control device may be provided that operates together with the drive device and that, independently of a predetermined angular illumination distribution of the projection light in the object plane, stimulates the drive device to set a predetermined position of the optical element that can be disposed in various angular positions around an axis perpendicular to the field plane. The adjustment of the angular illumination distribution in this way after an appropriate input has taken place can be automated. In this connection, the input may take place, for example, by automatic reading of information assigned to the object so that the projection exposure method can proceed in an automated manner even if the nature of the object is changed.

In this connection, at least one detector device, operating together with the control device, may be provided for determining the intensity distribution of the projection light in a plane perpendicular to the optical axis. With the aid of such a detector device, the intensity distribution of the projection light can be monitored and conclusions can be drawn therefrom about the effect of the optical element or elements that can be disposed in various angular positions.

The detector device may be a two-dimensional CCD array. CCD arrays are photosensitive and have a high positional resolution.

The detector device may be designed in such a way that it determines the angular illumination distribution of the projection light in the object plane. This makes possible a direct feedback in which the measured angular illumination distribution is compared with a set-point value. This information can then be used to correct the angular illumination distribution with the aid of the optical element or elements that can be disposed in various angular positions. If an optical element is used that can be disposed in various angular positions by means of a drive device, the feedback may take place in a control loop.

BRIEF DESCRIPTION OF THE DRAWINGS

Exemplary embodiments are explained in greater detail below by reference to the drawings in which:

FIGS. 3–4 show alternative diffractive optical elements similar to FIG. 2.

BEST MODE FOR PRACTICING THE INVENTION

Figure 1:
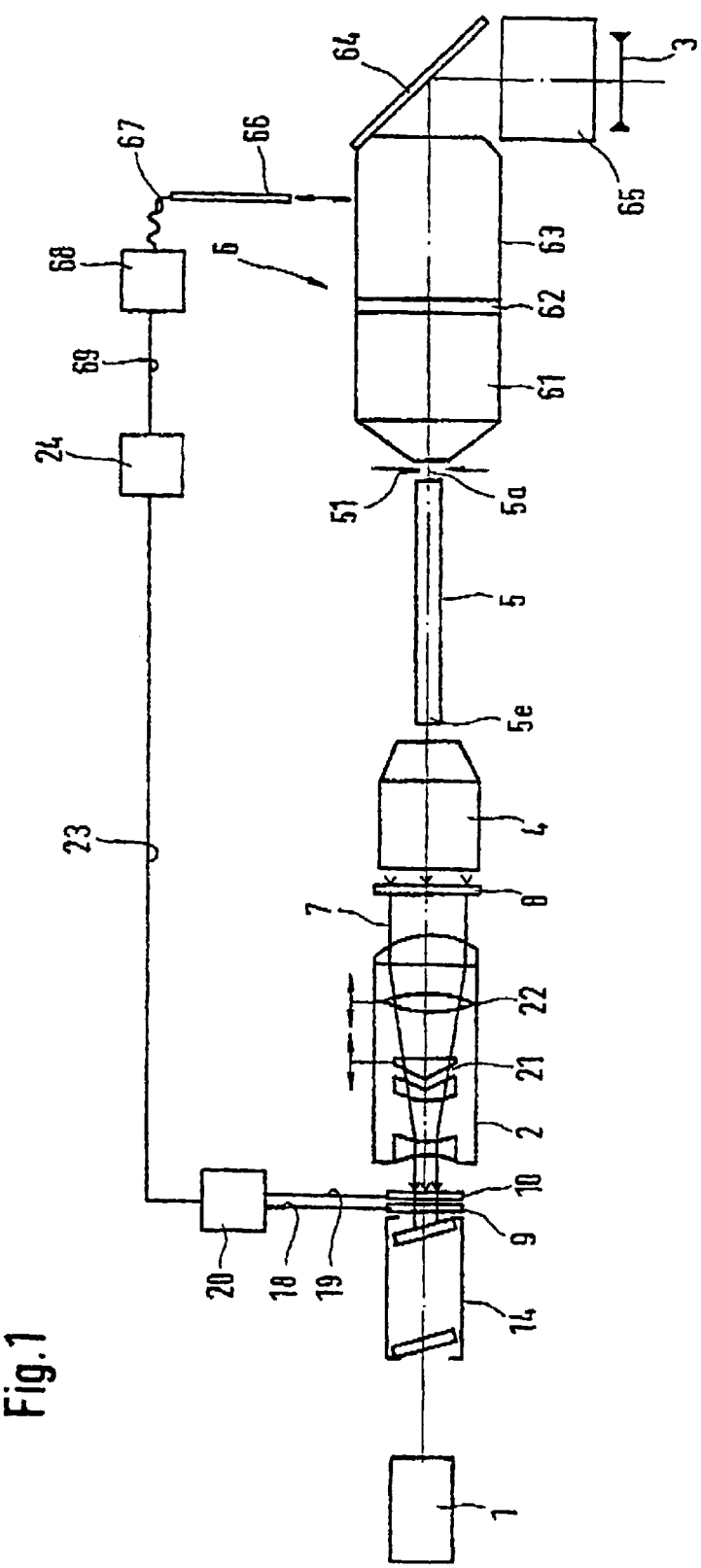
FIG. 1 shows a diagrammatic overview of a portion of a projection exposure system showing, in particular the illumination optics.

The portion, shown in FIG. 1, of a projection exposure system serves to preset and shape the projection light for illuminating a reticle 3 that has a structure that is transmitted by means of projection optics, not shown, onto a wafer, likewise not shown. The totality of the optical components that are described in still greater detail below and that are used for said shaping of the projection light is also described as "illumination optics".

A laser 1 serves as projection light source. It is ArF excimer laser standard in microlithography in the deep ultraviolet (DUV) having a wavelength of 193 nm or an $F_2$ laser having a wavelength of 157 nm. It generates a projection light beam 7 shown only in places in FIG. 1.

A beam expander 14, for example a telescope or a mirror arrangement, serves to reduce the beam divergence and to increase the beam cross section of the projection light beam 7, for example onto a rectangle having typical side lengths of y=35"10 mm and x=10"5 mm.

After passing through the beam expander 14, the projection light beam 7 passes through two diffractive optical elements 9, 10 disposed behind one another along the optical axis of the illumination optics. The two diffractive optical elements 9, 10, which are described in greater detail below by reference to FIG. 2, are disposed in the vicinity of a field plane of the illumination optics.

Figure 2:
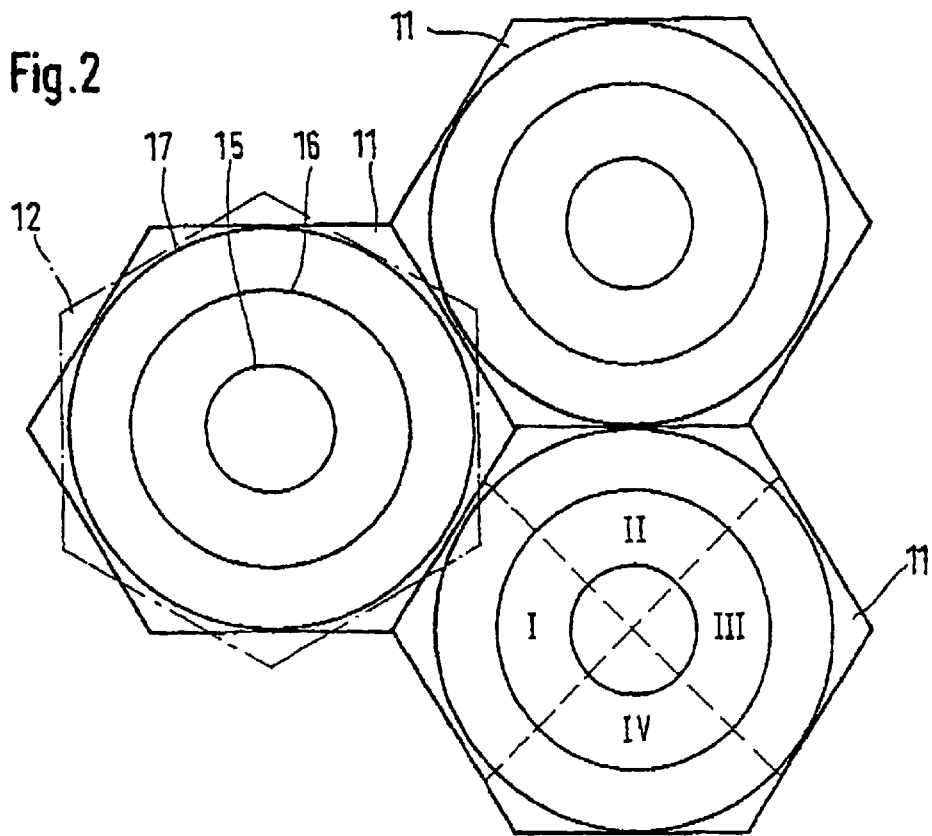
FIG. 2 shows a part, in plan view, of a diffractive optical element used in the projection exposure system of FIG. 1.

FIG. 2 shows a portion of the diffractive optical element 9 that is passed through first by the projection light beam 7 and that comprises three hexagonal individual structures 11. A multiplicity of such individual structures 11 that gaplessly adjoin one another forms the diffractive optical element 9 as a two-dimensional raster structure. The hexagonal individual structures 11 have a side length of approximately 1 mm.

Each individual structure 11 is a diffractive divergent lens. In the representation of FIG. 2, it has three annular structures 15 to 17. In practice, a very much larger number of annular structures 15 to 17 may also be present within an individual structure 11. The annular structures 15 to 17 have a thickness in the order of magnitude of the wavelength of the projection light. The annular structures 15 to 17 are produced by photolithography and etching.

An individual structure 12 of the diffractive optical element 10, which is constructed in exactly the same way as the diffractive optical element 9, is shown in FIG. 2 by a chain-dot line. The individual structure 12 is rotated with respect to the individual structure 11 in such a way that the angular position of a corner of the individual structure 12 coincides with the angular position of the center of a side of the individual structure 11.

The two diffractive optical elements 9, 10 are coupled, as indicated by rods in FIG. 1, by means of mechanical components 18, 19 to a drive device 20. The latter is connected via a control line 23 to a control device 24. The diffractive optical elements 9, 10 are disposed in the vicinity of an object plane of an objective 2. The latter is a zoom objective having zoom lens 22 and integrated axicon pair 21. By means of the zoom lens 22, the focal length of the objective 2 can be adjusted over a relatively large range so that illumination settings having different maximum illumination angles can be generated. In addition, adapted annular illumination settings can be adjusted by displacing the axicon pair 21.

Disposed downstream of the objective 2 is a further diffractive optical element 8 whose raster structure corresponds to that of the diffractive optical elements 9 and 10, but individual structures having another area configuration may be used. Examples of such individual structures are also given below.

After passing through the diffractive optical element 8, the projection light beam 7 passes through an objective 4. This transmits the projection light beam 7 to the entry face 5e of a glass rod 5 that mixes and homogenizes the light by multiple internal reflection. Situated in the vicinity of the exit face 5a of the glass rod 5 is a field plane of the illumination optics in which a reticle masking system (REMA) is disposed. The latter is formed by an adjustable field stop 51.

After passing through the field stop 51, the projection light beam 7 passes through a further objective 6 comprising lens groups 61, 63, 65, path-folding mirror 64 and pupillary plane 62. The object 6 images the field plane of the field stop 51 on the reticle 3.

In exposure gaps, a CCD array 66 can be inserted into the lens group 63 by means of a drive device that is not shown. This is part of a detector device with which an intensity distribution of the projection light beam 7 can be measured in a plane perpendicular to the optical axis. The CCD array 66 is connected to a detector control device 68 via a data line 67. The latter is connected via a line 69 to a control device 24.

The effect of the diffractive optical elements 8 to 10 on the angular illumination distribution of the projection light beam 7 passing through them is described below:

Drawn in FIG. 2 in the lower right individual structure 11 as imaginary separating lines are two broken lines that cross at right angles and that subdivide the individual structure 11 into four quadrants I to IV. The quadrants II and IV have greater surface area than the quadrants I and III. If, therefore, the individual structures 11 in FIG. 2 are homogeneously illuminated by the projection light beam 7, a greater amount of projection light consequently passes through the quadrants II and IV compared with the amount of projection light that passes through the quadrants I and III. Therefore, because of the divergent effect of the individual structures 11, more light is scattered in FIG. 2 upwards and downwards than to the right or left by each individual structure 11.

In total, therefore, the diffractive optical element 9 impresses an ellipticity of the angular illumination distribution of the projection light.

Analogously to the comments above in connection with the individual structure 11, the individual structures 12 of the diffractive optical element 10 scatter more light in FIG. 2 to the right and left than upwards or downwards. The ellipse illustrating the ellipticity of the angular illumination distribution is rotated through 90E in the case of the diffractive element 10 having individual structures 12 in the position shown in FIG. 2 compared with the diffractive optical element 9.

The diffractive optical element 8 serves to adapt the aspect ratio of the projection light beam 7 to the aspect ratio of the entry face Se of the glass rod 5.

The non-rotationally symmetrical effect of the diffractive optical elements 8 to 10 makes it possible to impress either a totally non-rotationally symmetrical angular illumination distribution on a projection light beam 7 having originally symmetrical angular illumination distribution, or an even originally non-rotationally symmetrical angular illumination distribution of the projection beam 7 can be systematically manipulated.

The diffractive optical element 9 can be rotated around the optical axis by means of the drive device 20 via the mechanical component 18. In this process, the ellipse that describes the component of the angular illumination distribution that is impressed by the optical element 9 rotates concomitantly. Therefore, said ellipse can be oriented by rotating the diffractive optical element 9 in such a way that an angular illumination distribution that was elliptical originally, i.e. not taking account of the effect of the optical element 9, can be symmetrized with any desired orientation. Alternatively, rotation of the diffractive optical element 9 can set a predetermined elliptical angular illumination distribution that is advantageous, for example, for illuminating certain structures on the reticle 3.

The generated change in the angular illumination distribution can be finely adjusted with the second diffractive optical element 10, which can likewise be rotated around the optical axis by means of the mechanical components 19 of the drive device 20 independently of the first diffractive optical element 9. If the two diffractive optical elements 9, 10 are disposed behind one another in such a way that the individual sides of the individual structures 11, 12 extend parallel to one another, both diffractive optical elements 9, 10 impress the same non-rotationally symmetrical angular illumination distribution, with the result that an enhanced overall effect is achieved.

If the two diffractive optical elements 9, 10 are rotated through an angle relative to one another, a change in the angular illumination distribution results that can be described as superimposition of two ellipses whose major axes mutually assume an angle corresponding to the angle of rotation.

The ellipses of the diffractive optical elements 9 and 10, which ellipses describe the non-rotationally symmetrical modification on the angular illumination distribution of the projection light beam 7, are at right angles to one another in the case, shown in FIG. 2, of the relative positions of the individual structures 11 and 12. There results an overall change in the angular illumination distribution because of the superimposition of the changes due to the individual diffractive optical elements 9 and 10 whose deviation from rotational symmetry is less than the change due to each optical component. In this relative position of the individual structures 11 and 12, for example, the ellipticity may remain unmodified by the diffractive optical elements 9 and 10. Such a position of the optical elements 9 and 10, which is described as neutral position, is chosen, for example, if it is intended to determine the symmetry which the angular illumination distribution of the projection light beam 7 has without or only with a slight asymmetrical modification of the diffractive optical elements 9, 10.

The illumination optics that are shown in FIGS. 1 and 2 are operated as follows:

At the beginning of the projection exposure or in an exposure gap, the intensity distribution of the projection light beam 7 is measured in the vicinity of the lens group 63 with the aid of the CCD array 66. An angular illumination distribution in the object plane of the projection optics is calculated therefrom and compared with a predetermined angular illumination distribution for the optimum illumination of the reticle 3. If a correction of the measured angular illumination distribution is necessary, the above described neutral position of the diffractive optical elements 9, 10 is first set by means of the detector control device 68, the control device 24 and also the drive device 20. The angular illumination distribution of the unmodified projection light beam 7 is then measured and, if necessary, corrected by a basic alignment of the illumination optics. Finally, set-point position of the two diffractive optical elements 9, 10 is calculated by comparing the actual and set-point values of the angular illumination distribution and is set by means of the drive device 20. The CCD array is then retracted from the lens group 63.

The degree of rotational asymmetry of the angular illumination distribution, that is to say, to a first approximation, the ellipticity, can be modified by the shape of the individual structures. In the case of the hexagonal individual structures 11, 12, an ellipse can be achieved that has a main axis ratio of approximately 1.05 or longer to shorter main axis. Said main axis ratio can be increased virtually as desired by lengthening two opposite sides of the hexagonal individual structures 11, 12, gapless occupancy of the area predetermined by the diffractive optical element still prevailing. Other gapless occupancies having individual structures built up in a more complex way compared with a hexagon result in correspondingly more complicated angular illumination distributions, which may additionally provide multi-pole contributions to the change in the angular illumination distribution.

A neutral position of the optical elements 9 and 10 that does not result in any change in the symmetry of the angular illumination distribution of the projection light passing through can be achieved, for example, by two optical elements in which the shapes of the individual structures can be supplemented to form a circle. Examples of such individual structures are semicircles.

The diffractive optical elements 9, 10 are disposed in the present case in the vicinity of the object plane of the objective 2, but can be used in the vicinity of any desired field plane of the illumination optics and, if a modification of the angular illumination distribution is necessary there, even in the vicinity of field planes of the projection optics placed behind the reticle 3.

Instead of diffractive optical elements, lens arrays may also be used that have a multiplicity of individual lenses with refractive faces that, like the individual structures described above, gaplessly cover the aperture of the lens array. The edge contour of the individual lens predetermines in this case, as described above in connection with the individual structures, the change in the symmetry of the angular illumination distribution.

Figure 3:
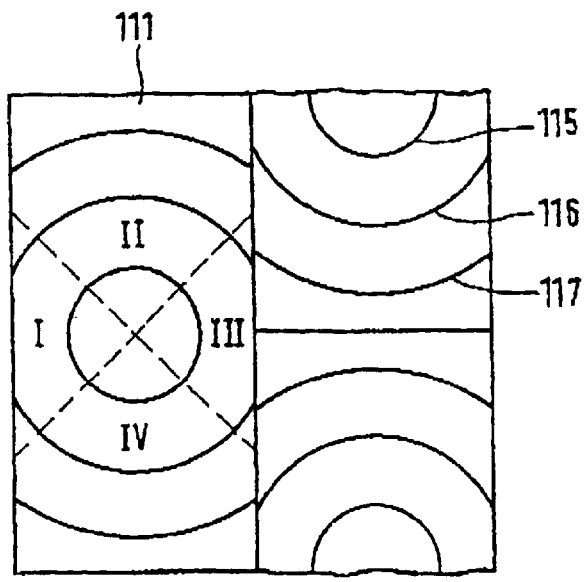

FIGS. 3 and 4 specify alternative exemplary embodiments for individual structures, such as can be used, for example, in the case of the diffractive optical element 8. Optical structures that correspond to those already described in connection with FIGS. 1 and 2 have reference symbols increased by 100 and are not explained in detail yet again.

The individual structures 111 of the diffractive optical element, of which only a portion is shown in FIG. 3 similarly to FIG. 2, are rectangular with an aspect ratio of 1:2. As is shown by the division of the individual structure into quadrants I to IV, which is analogous to that of FIG. 2, the quadrants II and IV have a substantially greater surface area here than the quadrants I and III. Consequently, the diffractive optical element of FIG. 3 has a correspondingly larger ellipticity than that of FIG. 2.

In the exemplary embodiment according to FIG. 4, individual structures 211 are square. Here, the non-rotationally symmetrical change in the angular illumination distribution of the incident projection light by the individual structures 211 in regard to the ellipticity is not based here on a non-rotationally symmetrical boundary since the boundaries of the individual structures 211 have a four-fold symmetry and are consequently symmetrical as far as the ellipticity is concerned.

The non-rotationally symmetrical change in the angular illumination distribution in the case of the individual structures 211 is based on non-homogeneous diffractive modification of the projection light. For this purpose, every individual structure 211 in the representation of FIG. 4 has three elliptical structures 215 to 217 for diffracting the incident projection light. The diffraction at said elliptical structures 215 to 217 brings about a non-rotationally symmetrical change in the angular illumination distribution after passing through the individual structures 211. Since the elliptical structures 215 to 217 have a two-fold symmetry, the ellipticity of the projection light changes on passing through the individual structures 211.

What is claimed is:

1. A projection exposure system for generating an image of an object disposed in an object plane in an image plane by a light source emitting projection light, comprising a beam path, illumination optics disposed in the beam path between the light source and the object plane, projection optics disposed in the beam path between the object plane and the image plane, and at least one optical element that is disposed in the vicinity of a field plane of the illumination optics and imposes a changes of the angular illumination distribution of the projection light in the object plane, said change being non-rotationally symmetrical with respect to the optical axis, characterized in that the at least one optical element has at least a first angular position and a second angular position and is capable of rotating between the first and second angular positions around an axis perpendicular to the field plane.

2. The projection exposure system according to claim 1, characterized in that the at least one optical element is a diffractive optical element.

3. The projection exposure system according to claim 1, characterized in that the at least one optical element is a raster element having a two-dimensional raster structure that is made up of a multiplicity of individual structures adjoining one another and having identical area configuration.

4. The projection exposure system according to claim 3, characterized in that the individual structures adjoin one another without gap.

5. The projection exposure system according to claim 3, characterized in that the individual structures are designed in such a way that a non-rotationally symmetrical change in the angular illumination distribution they impose is based at least partly on a non-homogeneous modification of the diffraction of the projection light.

6. The projection exposure system according to claim 3, characterized in that the individual structures are designed in such a way that the non-rotationally symmetrical change in the angular illumination distribution they impose is based at least partly on a non-rotationally symmetrical boundary of the individual structures.

7. The projection exposure system according to claim 6, characterized in that at least one of the individual structures has the shape of a hexagon.

8. The projection exposure system according to claim 1, characterized by at least two optical elements that are each disposed in the vicinity of a field plane of the illumination optics which change the angular illumination distribution of the projection light passing through and each have a least a first angular position and a second angular position and are capable of independently rotating between the first and second angular positions around an axis perpendicular to the field plane.

9. The projection exposure system according to claim 8, characterized in that there is a relative position of the at least two optical elements in which no change in the symmetry of the angular illumination distribution results.

10. The projection exposure system according to claim 1, characterized by a drive device coupled to each of the at least one optical element that can be disposed in various angular positions around an axis perpendicular to the field plane.

11. The projection exposure system according to claim 10, characterized by a control device that operates together with the drive device and that, independently of a predetermined angular illumination distribution of the projection light in the object plane, stimulates the drive device to set a predetermined position of the at least one optical element.

12. The projection exposure system according to claim 11, characterized in that at least one detector device operating together with the control device is provided for determining intensity distribution of the projection light in a plane perpendicular to the optical axis.

13. The projection exposure system according to claim 12, characterized in that the detector device has a two-dimensional CCD array.

14. The projection exposure system according to claim 11, characterized in that the detector device is designed in such a way that it determines the angular illumination distribution of the projection light in the object plane.

15. A projection exposure system for generating an image of an object disposed in an object plane by a light source emitting projection light, comprising a beam path, illumination optics disposed in the beam path between the light source and the object plane, projection optics disposed in the beam path between the object plane and the image plane, and at least one optical element that is disposed in the vicinity of a field plane of the illumination optics and imposes a change of the angular illumination distribution of the projection light in the object plane, said change being non-rotationally symmetrical with respect to the optical axis, characterized in that the at least one optical element comprises a plurality of optical elements and that the system comprises an interchange holder into which the plurality of optical elements can be interchangeably introduced for achieving different angular illumination distributions.

16. The projection exposure system according to claim 15, characterized in that the at least one optical element is a diffractive optical element.

17. The projection exposure system according to claim 15, characterized in that the at least one optical element is a raster element having a two-dimensional raster structure that is made up of a multiplicity of individual structures adjoining one another and having identical area configuration.

18. The projection exposure system according to claim 17, characterized in that the individual structures adjoin one another without gap.

19. The projection exposure system according to claim 17, characterized in that the individual structures are designed in such a way that a non-rotationally symmetrical change in the angular illumination distribution they impose is based at least partly on a non-homogeneous modification of the diffraction of the projection light.

20. The projection exposure system according to claim 17, characterized in that the individual structures are designed in such a way that the non-rotationally symmetrical change in the angular illumination distribution they impose is based at least partly on a non-rotationally symmetrical boundary of the individual structures.

21. The projection exposure system according to claim 20, characterized in that at least one of the individual structures has the shape of a hexagon.

22. The projection exposure system according to claim 15, characterized by at least two optical elements that are disposed in the vicinity of a field plane of the illumination optics and each impose a change of the angular illumination distribution of the projection light in the object plane, said change being non-rotationally symmetrical with respect to the optical axis, wherein the at least two optical elements each comprise a plurality of optical elements, and wherein the system comprises, for each of the at least two optical elements, an interchange holder into which the respective plurality of optical can be interchangeably introduced for achieving different angular illumination distributions.

23. The projection exposure system according to claim 15, characterized in that there is a relative position of the at least two optical elements in which no change in the symmetry of the angular illumination distribution results.

* * * * *